United States Patent [19]

Misheloff

[11] Patent Number: 5,548,526
[45] Date of Patent: Aug. 20, 1996

[54] TIMING MODEL AND CHARACTERIZATION SYSTEM FOR LOGIC SIMULATION OF INTEGRATED CIRCUITS

[75] Inventor: Michael N. Misheloff, Dublin, Calif.

[73] Assignee: VLSI Technology, Inc.

[21] Appl. No.: 849,242

[22] Filed: Mar. 11, 1992

[51] Int. Cl.⁶ .............................. G06F 17/10; G06F 17/17
[52] U.S. Cl. ........................... 364/491; 364/490; 364/578
[58] Field of Search ................................ 364/488, 489, 364/490, 491, 578

[56] References Cited

U.S. PATENT DOCUMENTS

| 4,827,428 | 5/1989 | Dunlop et al. | 364/490 |
| 4,924,430 | 5/1990 | Zasio et al. | 364/488 |
| 5,095,454 | 3/1992 | Huang | 364/578 |
| 5,231,598 | 7/1993 | Vlahos | 364/579 |

OTHER PUBLICATIONS

Dhimant Patel, "Charms: Characterization and Modeling System for Accurate Delay Prediction of ASIC Systems", IEEE 1990 Custom Integrated Circuit Conference, Paper 9.5.1.

An—Chang Deng, Piecewise–Linear Timing Delay Modeling for Digital CMOS Circuits, *IEEE Transactions on Circuits and Systems*, vol. 35, No. 10, Oct. 1988, pp. 1330–1334.

Delay Equations For Timing Analysis, *IBM Technical Disclosure Bulletin*, vol. 34, No. 1, Jun. 1991, pp. 186,187.

*Primary Examiner*—Kevin J. Teska
*Assistant Examiner*—Tyrone V. Walker
*Attorney, Agent, or Firm*—Douglas L. Weller

[57] ABSTRACT

A method approximates propagation delay through a logic device. Operation of the logic device is divided into a first region and a second region. A boundary between the first region and the second is based on duration of input ramp to the logic device and amount of capacitive load driven by the logic device. For example, the boundary between the first region and the second occurs where for each value of the capacitive load, an output ramp for the logic device is one half complete when the input ramp is complete. When the logic device operates in the first region, a first formula is used to obtain a first value representing delay through the logic device. The first formula varies the first value based on the duration of the input ramp to the logic device and the capacitive load driven by the logic device. When the logic device operates in the second region, a second formula is used to obtain the first value. The second formula also varies the first value based on the duration of the input ramp to the logic device and the capacitive load driven by the logic device.

41 Claims, 7 Drawing Sheets

TIMING MODEL AND CHARACTERIZATION SYSTEM FOR LOGIC SIMULATION OF INTEGRATED CIRCUITS

BACKGROUND

The present invention concerns an accurate timing model for logic simulation of integrated circuits. The timing model reflects the timing delays caused by input ramp and output load of circuitry.

When designing an integrated circuit, it is generally desirable to simulate the functioning of logic circuitry within the integrated circuit. In order to accurately access the performance of the circuitry, it is additionally desirable that the logic simulation of logic include an accurate assessment of timing delays through the circuitry, at least in the critical paths.

In general, timing delays through circuitry are caused by propagation delays through and between logic cells which comprise the circuitry. The actual amount of propagation delay through and between logic cells is generally dependent on various capacitances within and between the logic cells, as well as the current available to charge or discharge the capacitances.

When developing a timing model, it is desirable to take into account the time delay introduced by charging the input capacitance of logic cells. This time delay is directly affected by the input current available to charge the input capacitance to the logic cell. This input current, in turn, is directly affected by the fan out of the output of the logic cell providing the input current.

In the prior art, timing delay caused by charging input capacitance was approximated as being directly proportional to the output fan out of the logic cell providing current for the input. However, this has proved to be an inaccurate modelling technique because propagation delay through the logic cell is additionally influenced by the shape of the voltage input ramp of the input signal to the logic cell. The effect of the shape of the voltage input ramp on the timing delay may be approximated by using general piecewise linear functions of the voltage input ramp and the output load. However, this approach does not easily lead to a practical characterization system. In order to obtain a fairly accurate timing model, a circuit simulation needs to be performed for every grid point of the function. A sufficient number of grid points need to selected to obtain the desired accuracy of the timing model. This can require numerous circuit simulations.

SUMMARY OF THE INVENTION

In accordance with the preferred embodiment of the present invention, a method is presented for approximating propagation delay through a logic device. Operation of the logic device is divided into a first region and a second region. A boundary between the first region and the second is based on duration of input ramp to the logic device and amount of capacitive load driven by the logic device. For example, the boundary between the first region and the second occurs where for each value of the capacitive load, an output ramp for the logic device is one half complete when the input ramp is complete.

When the logic device operates in the first region, a first formula is used to obtain a first value representing delay through the logic device. The first formula varies the first value based on the duration of the input ramp to the logic device and the capacitive load driven by the logic device. When the logic device operates in the second region, a second formula is used to obtain the first value. The second formula also varies the first value based on the duration of the input ramp to the logic device and the capacitive load driven by the logic device.

For example, the first formula may have a form as follows:

$$DT_0 = A_0 + B*(\text{INPUT RAMP}) + D_0*(\text{LOAD})$$

where $DT_0$ represents the first value, INPUT RAMP represents duration of the input ramp, LOAD represents capacitive load driven by the logic device, and $A_0$, $B$ and $D_0$ are coefficients determined using circuit simulations.

Similarly, the second formula may have a form as follows:

$$DT_0 = A_0 + B*(\text{CRITINRAMP}) + D_0(\text{LOAD}) + Z*(\text{INPUT RAMP} - \text{CRITINRAMP})$$

where CRITINRAMP represents INPUTRAMP at the border between the first region and the second region for the LOAD, and Z is determined using circuit simulations.

The above examples for the first formula and the second formula use first order linear approximations for the input ramp of the logic device. Alternately a second order approximation of the input ramp may include "tails" of the input ramp. Using the second order model, the first formula may have a form as follows:

$$DT_0 = A_0 + FAT*B*(\text{INPUT RAMP}) + D_0*(\text{LOAD})$$

wherein $DT_0$ represents the first value, INPUTRAMP represents duration of the input ramp, LOAD represents capacitive load driven by the logic device, and $A_0$, $B$, $D_0$ and FAT are coefficients determined using circuit simulations.

Similarly, using the second order model, the second order model may have a form as follows:

$$DT_0 = DT_0(\text{CRITINRAMP}) + Z*(\text{INPUTRAMP} - \text{CRITINRAMP})$$

wherein CRITINRAMP represents INPUTRAMP at the border between the first region and the second region for the LOAD, Z is a coefficient determined using circuit simulations, and $DT_{(CRITINRAMP)}$ is the first value when the logic ramp has an input ramp equal to CRITINRAMP and a load equal to LOAD.

In the preferred embodiment of the present invention, the method also includes calculating a next input ramp for a next logic device coupled to an output of the logic device. When the logic device operates in the first region, a third formula is used to generate a second value representing duration from beginning of the input ramp of the logic device to an end of an output ramp of the logic device. The second value is based on the length of the input ramp to the logic device and the amount of the load driven by the logic device. When the logic device operates in the second region, a fourth formula is used to generate the second value. The first value is then subtracted from the second value to obtain the next input ramp.

For example, the third formula may have a form as follows:

$$DT_1 = A_1 + B*(\text{INPUT RAMP}) + D_1*(\text{LOAD})$$

where $DT_1$ represents the second value, and $A_1$ and $D_1$ are coefficients determined using circuit simulations. Similarly, the fourth formula may have a form as follows:

$$DT_1 = A_1 + B*(\text{INPUT RAMP}) + D_1*(\text{LOAD}).$$

Alternately, using the second order model which takes into account "tails" of the input ramp, the third formula may have a form as follows:

$$DT_1 = A_1 + FAT*B*(\text{INPUT RAMP}) + D_1*(\text{LOAD})$$

wherein $DT_1$ represents the second value, and $A_1$ and $D_1$ are coefficients determined using circuit simulations. Similarly, using the second order model, fourth formula may have a form as follows:

$$DT_1 = DT_1(\text{CRITINRAMP}) + B*(\text{INPUT RAMP} - \text{CRITINRAMP}).$$

The present invention is advantageous over the prior art in that it allows for a fairly accurate timing model of a logic device with the need to perform only a limited number of circuit simulations.

DESCRIPTION OF THE PREFERRED EMBODIMENT

Figure 1:
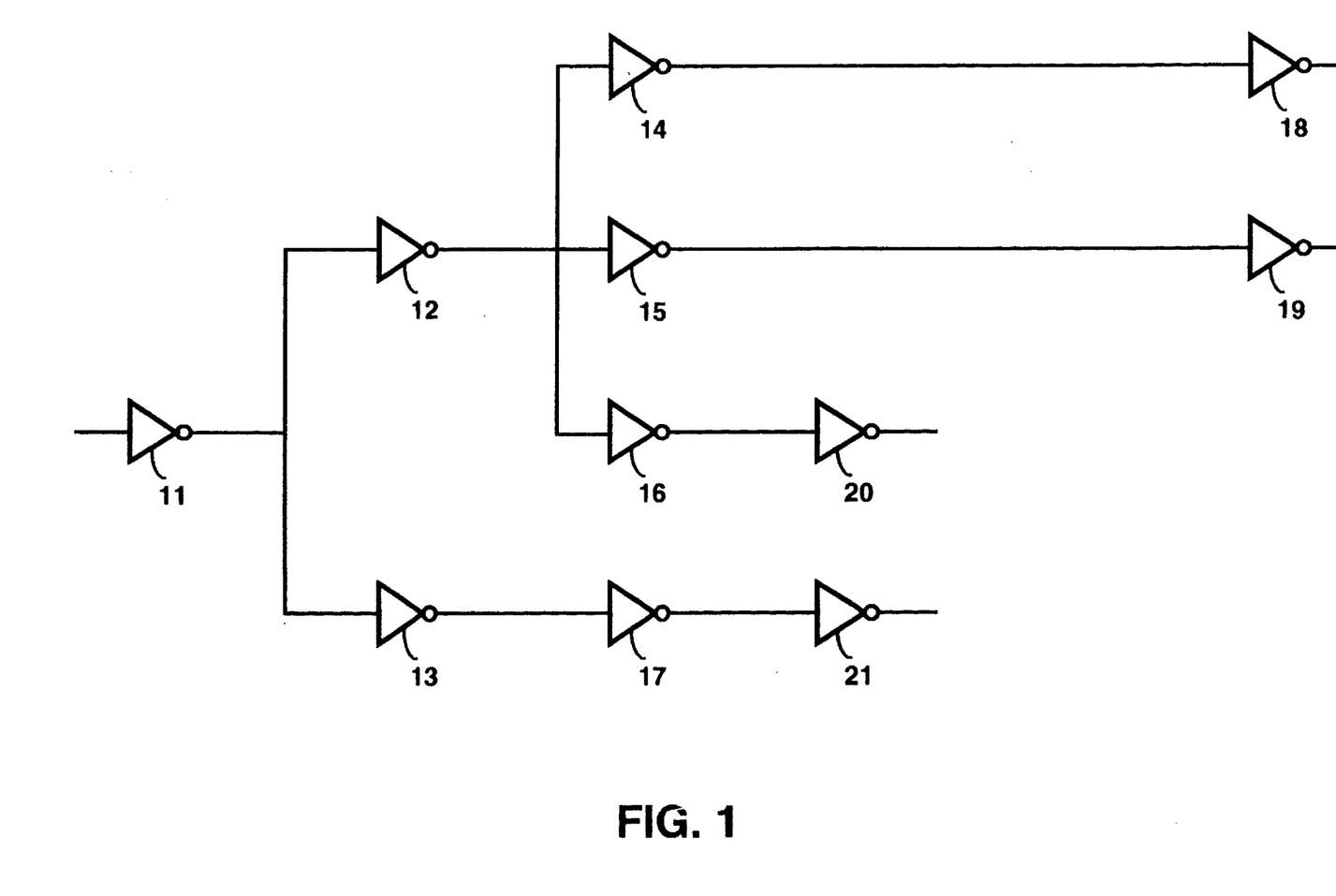
FIG. 1 shows an example of circuitry through which propagation delay may be calculated.

There are many causes of propagation delay through logic circuitry. For example, FIG. 1 shows circuitry which includes a logic device 11, a logic device 12, a logic device 13, a logic device 14, a logic device 15, a logic device 16, a logic device 17, a logic device 18, a logic device 19, a logic device 20 and a logic device 21 connected as shown. For simplicity in the discussion of the present invention, inverters as used for the logic devices. However, the present invention is applicable to all logic devices used in the manufacture of integrated circuits.

Causes for propagation delay through the circuitry shown in FIG. 1 include, for example, the time required to charge or discharge internal capacitance within each of logic devices 11–21, the time required to charge or discharge input capacitance to each of logic devices 11–21, and the time required to overcome inductance in the lines between logic devices 11–21. The present invention, however, focuses on the effects that input transition time and output load has on propagation delay. The input transition time of a logic device is the time required to charge or discharge input capacitance of the logic device. The output load is the total amount of capacitance which the logic device has to charge or discharge. The output load is directly affected by, for example, the fan out of the output of the logic device.

For example, as shown in FIG. 1, logic device 11 has a fan out of two. Logic device 12 has a fan out of three. Logic devices 13–17 have a fan out of one. Because of the relatively large fan out of logic device 12, it is expected that the output transition time of (and thus the propagation delay through) logic device 12 will take longer than, for example, the output transition time of logic device 13, which has a fan-out of only one.

Figure 2:
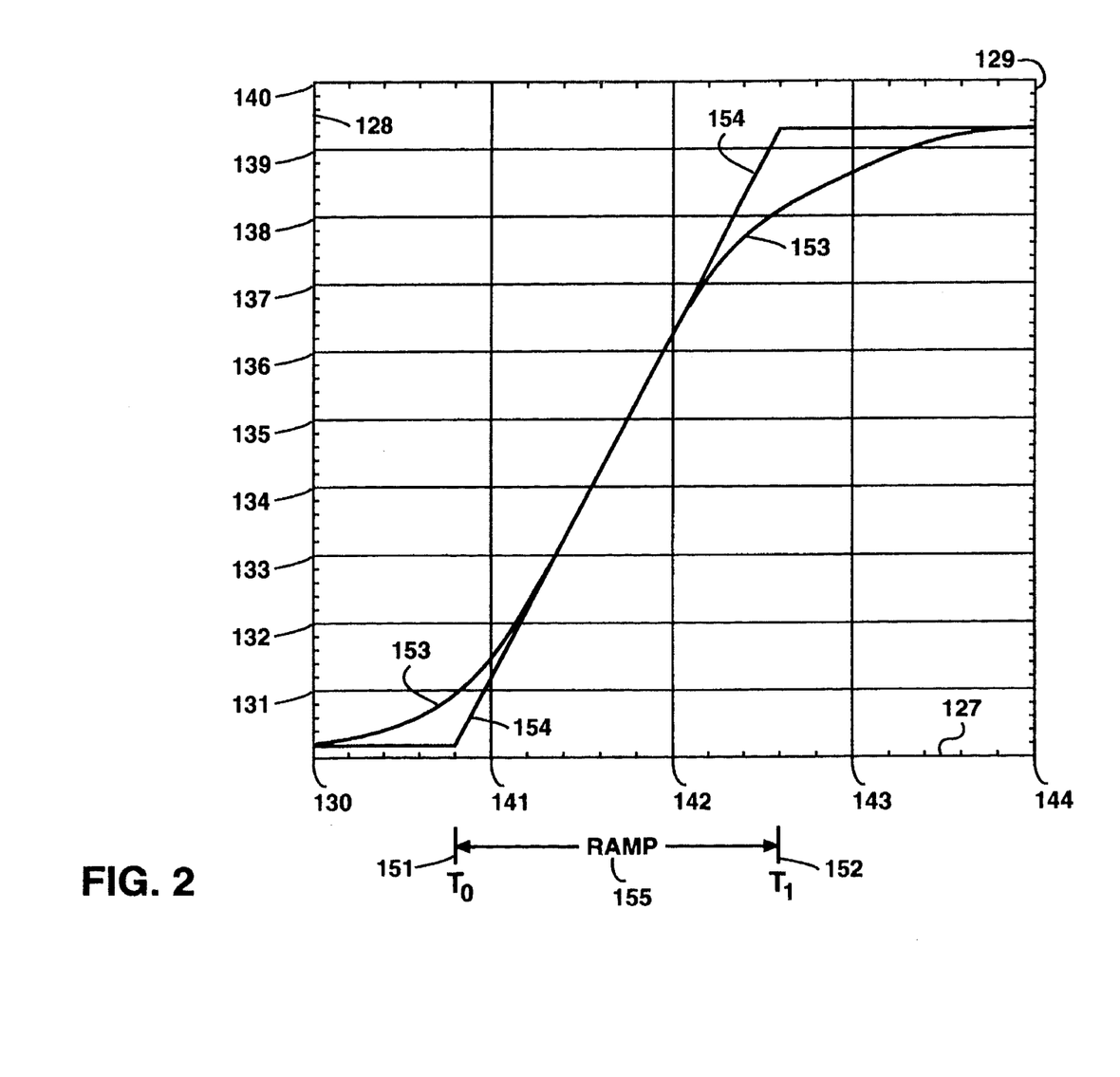
FIG. 2 shows a graph on which is superimposed a ramp waveform.

FIG. 2 shows a graph 129 on which is superimposed a ramp waveform 153 which represents a voltage ramp during a transition period. A vertical axis 128 of graph 129 represents voltage at an input or an output of a logic device. A horizontal axis 127 represents passage of time. A zero point 130 of graph 129 indicates zero voltage and the passage of zero nanoseconds. A point 141 on horizontal axis 127 represents the passage of 2.5 nanoseconds. A point 142 on horizontal axis 127 represents the passage of 5.0 nanoseconds. A point 143 on horizontal axis 127 represents the passage of 7.5 nanoseconds. A point 144 on horizontal axis 127 represents the passage of 10.0 nanoseconds. A point 131 on vertical axis 128 represents 0.5 volts. A point 132 on vertical axis 128 represents 1.0 volts. A point 133 on vertical axis 128 represents 1.5 volts. A point 134 on vertical axis 128 represents 2.0 volts. A point 135 on vertical axis 128 represents 2.5 volts. A point 136 on vertical axis 128 represents 3.0 volts. A point 137 on vertical axis 128 represents 3.5 volts. A point 138 on vertical axis 128 represents 4.0 volts. A point 139 on vertical axis 128 represents 4.5 volts. A point 140 on vertical axis 128 represents 5.0 volts.

Ramp waveform 153 shows voltage verses time for a transition from low to high. Ramp waveform 153 may be approximated by a waveform 154. Waveform 154 approximates as a straight line the transition of ramp waveform 153 from a low voltage to a high voltage. The total transition time 155, or ramp, of ramp waveform 153 is defined as the duration of time between a time 151 ($T_0$), which is the point at which waveform 154 begins to increase in voltage, and a time 152 ($T_1$), which is the point at which waveform 154 ceases to increase in voltage.

Figure 3:
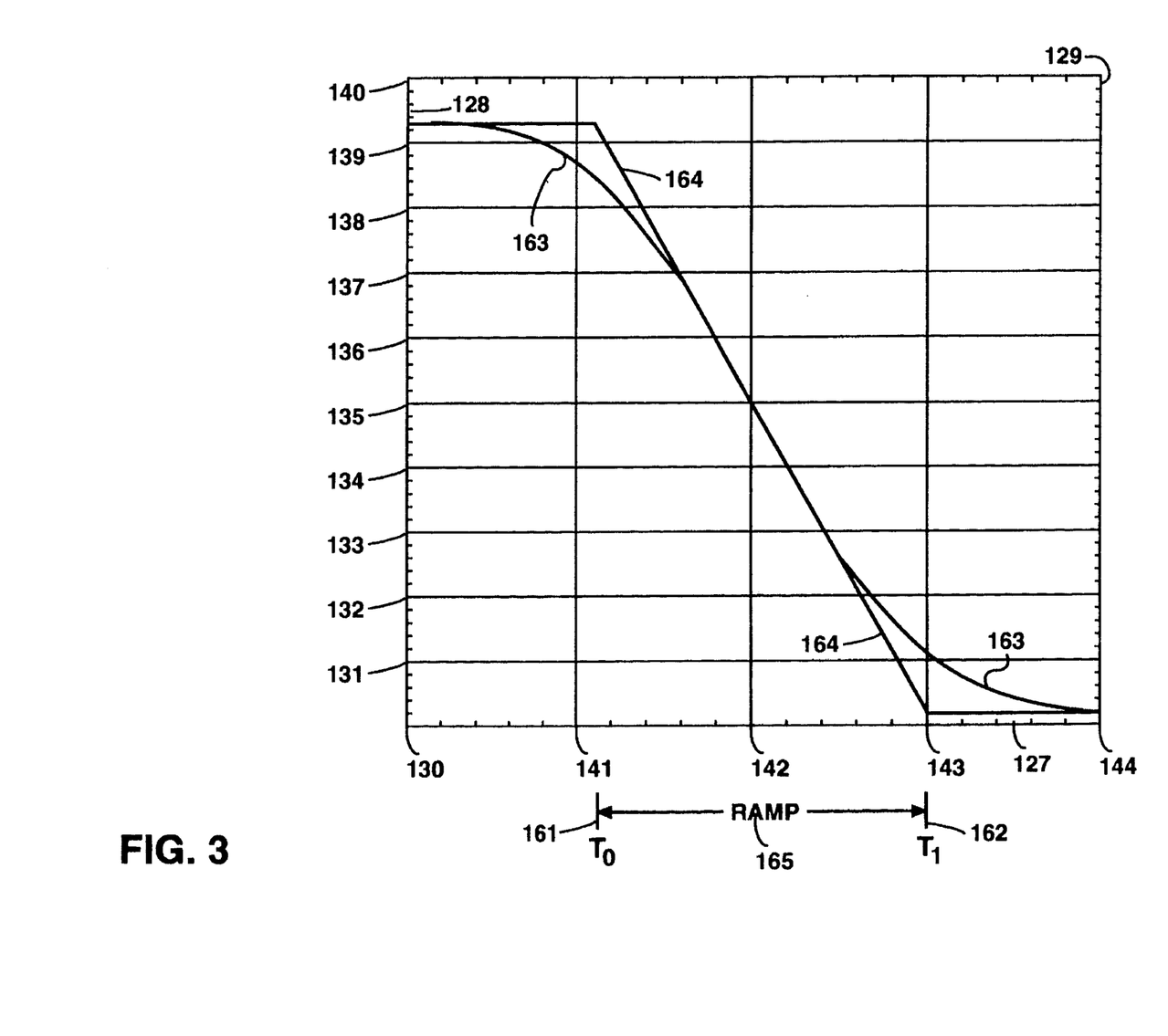
FIG. 3 shows a graph on which is superimposed a ramp waveform.

FIG. 3 shows a ramp waveform 163 superimposed on graph 129. Ramp waveform 163 shows voltage verses time for a transition from high to low. Ramp waveform 163 may be approximated by a waveform 164. Waveform 164 approximates as a straight line the transition of ramp waveform 163 from a high voltage to a low voltage. The total transition time 165, or ramp, of ramp waveform 163 is defined as the duration of time between a time 161 ($T_0$), which is the point at which waveform 164 begins to decrease in voltage, and a time 162 ($T_1$), which is the point at which waveform 164 ceases to decrease in voltage.

The terminology introduced in the discussion of FIGS. 2 and 3 may be used in the general description of input and output transition timing for a logic cell. For an input pin i (not shown) of a logic cell, the beginning of a ramp is defined as $T_{0,i}$ and the end of the ramp is defined as $T_{1,i}$. For an output pin j (not shown) of a logic cell, the beginning of a ramp is defined as $T_{0,j}$ and the end of the ramp is defined as $T_{1,j}$. Using this terminology, 50%–50% propagation delay (Tau) between input pin i and output pin j, is given by the following Formula 1:

Formula 1

$$Tau,ij = \tfrac{1}{2}(T_{1,j}+T_{0,j}) - \tfrac{1}{2}(T_{1,i}+T_{0,i})$$

While it is often the case that propagation delay is calculated using Tau, for the present invention, other calculated values may also be used. For example, the value $DT_0$ is defined as the difference in time between the beginning of the ramp for the input and the beginning of the ramp for the output. More generally, the value $DT_0$ between input pin i and output pin j is described by the following Formula 2:

Formula 2

$$DT_{0,ij} = T_{0,j} - T_{0,i}$$

The value $DT_1$ is defined as the difference in time between the beginning of the ramp for the input and the end of the ramp for the output. More generally, the value $DT_1$ between input pin i and output pin j is described by the following Formula 3:

Formula 3

$$DT_{1,ij} = T_{1,j} - T_{0,i}$$

Figure 4:
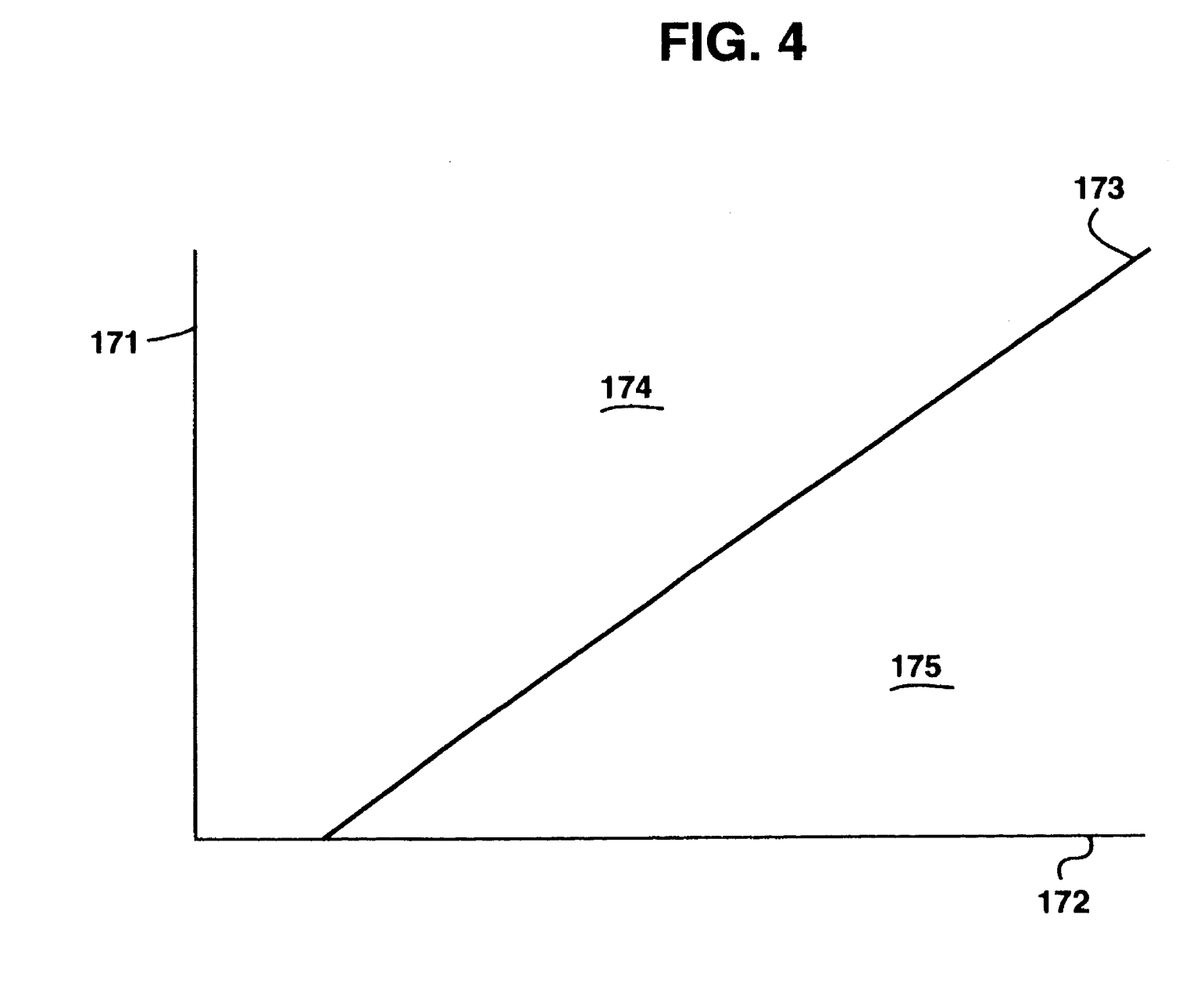
FIG. 4 shows two operation regions for a logic device in accordance with the preferred embodiment of the present invention.

For the present invention, two regions of operation of a logic device are considered. These regions are shown in FIG. 4. In FIG. 4, a vertical axis 171 represents increases in output load for the logic device. An axis 172 represents increase in time duration for the input ramp of the input ramp. A first region 174 is referred to as the fast input ramp region because in this region the input ramp rises relatively fast in comparison to the output ramp. A second region 175 is referred to as the slow input ramp region because in this region the input ramp rises relatively slowly in comparison to the output ramp. A dividing line 173 between fast input ramp region 174 and slow input ramp region 175 may be determined empirically as further discussed below.

Figure 5:
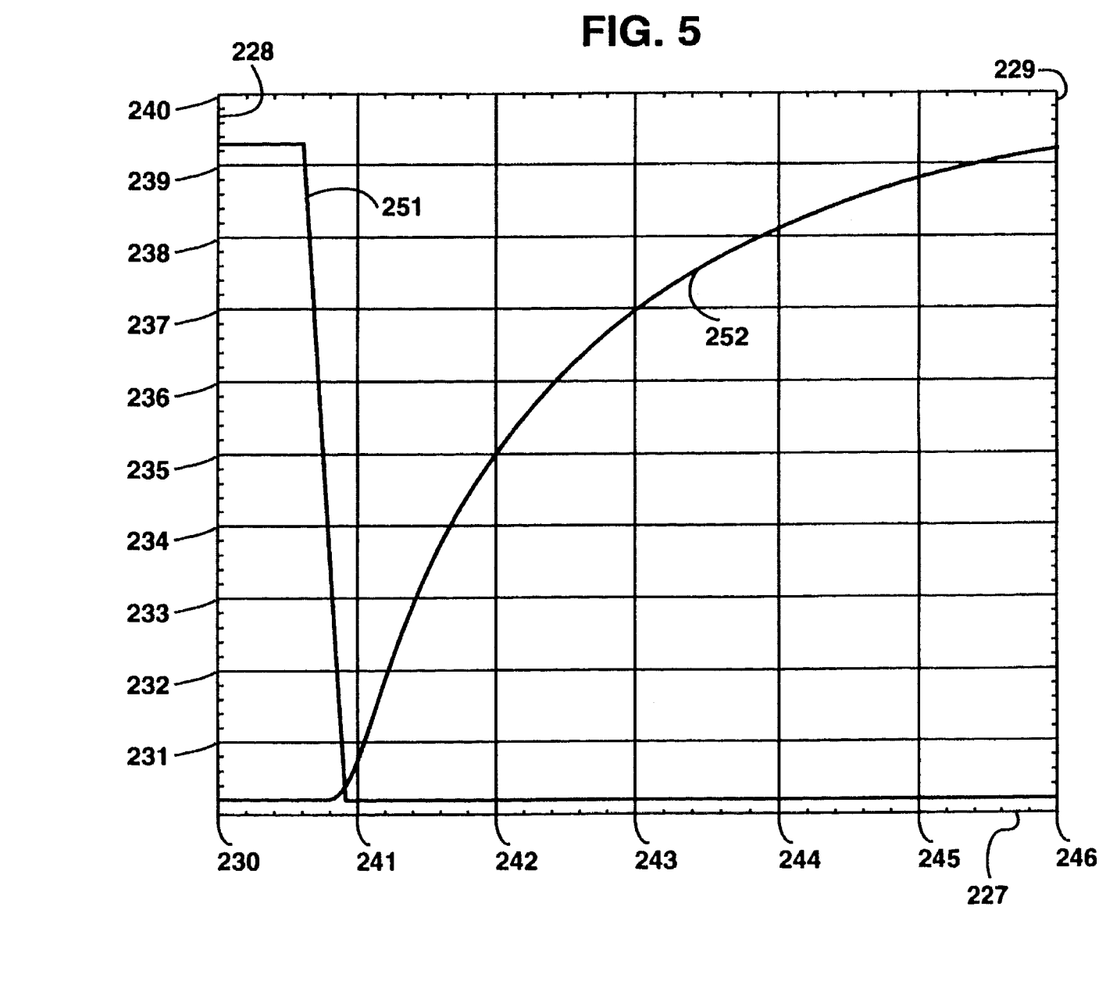
FIG. 5 shows a graph on which is superimposed an input ramp waveform and a resulting output ramp waveform in a first operation region shown in FIG. 4 in accordance with the preferred embodiment of the present invention.

FIG. 5 shows an example of an input ramp 251 and a resulting output signal waveform 252 in fast input ramp regions 174. As may be seen from FIG. 5, input ramp 251 falls at a relatively fast rate as compared to the rate of the rise of output signal waveform 252.

Input ramp 251 and output signal waveform 252 are superimposed on a graph 229. A vertical axis 228 of graph 229 represents voltage. A horizontal axis 227 represents passage of time. A zero point 230 of graph 229 indicates zero voltage and the passage of zero nanoseconds. A point 241 on horizontal axis 227 represents the passage of 1.67 nanoseconds. A point 242 on horizontal axis 227 represents the passage of 3.33 nanoseconds. A point 243 on horizontal axis 227 represents the passage of 5.00 nanoseconds. A point 244 on horizontal axis 227 represents the passage of 6.67 nanoseconds. A point 245 on horizontal axis 227 represents the passage of 8.33 nanoseconds. A point 246 on horizontal axis 227 represents the passage of 10.0 nanoseconds. A point 231 on vertical axis 228 represents 0.5 volts. A point 232 on vertical axis 228 represents 1.0 volts. A point 233 on vertical axis 228 represents 1.5 volts. A point 234 on vertical axis 228 represents 2.0 volts. A point 235 on vertical axis 228 represents 2.5 volts. A point 236 on vertical axis 228 represents 3.0 volts. A point 237 on vertical axis 228 represents 3.5 volts. A point 238 on vertical axis 228 represents 4.0 volts. A point 239 on vertical axis 228 represents 4.5 volts. A point 240 on vertical axis 228 represents 5.0 volts.

Figure 6:
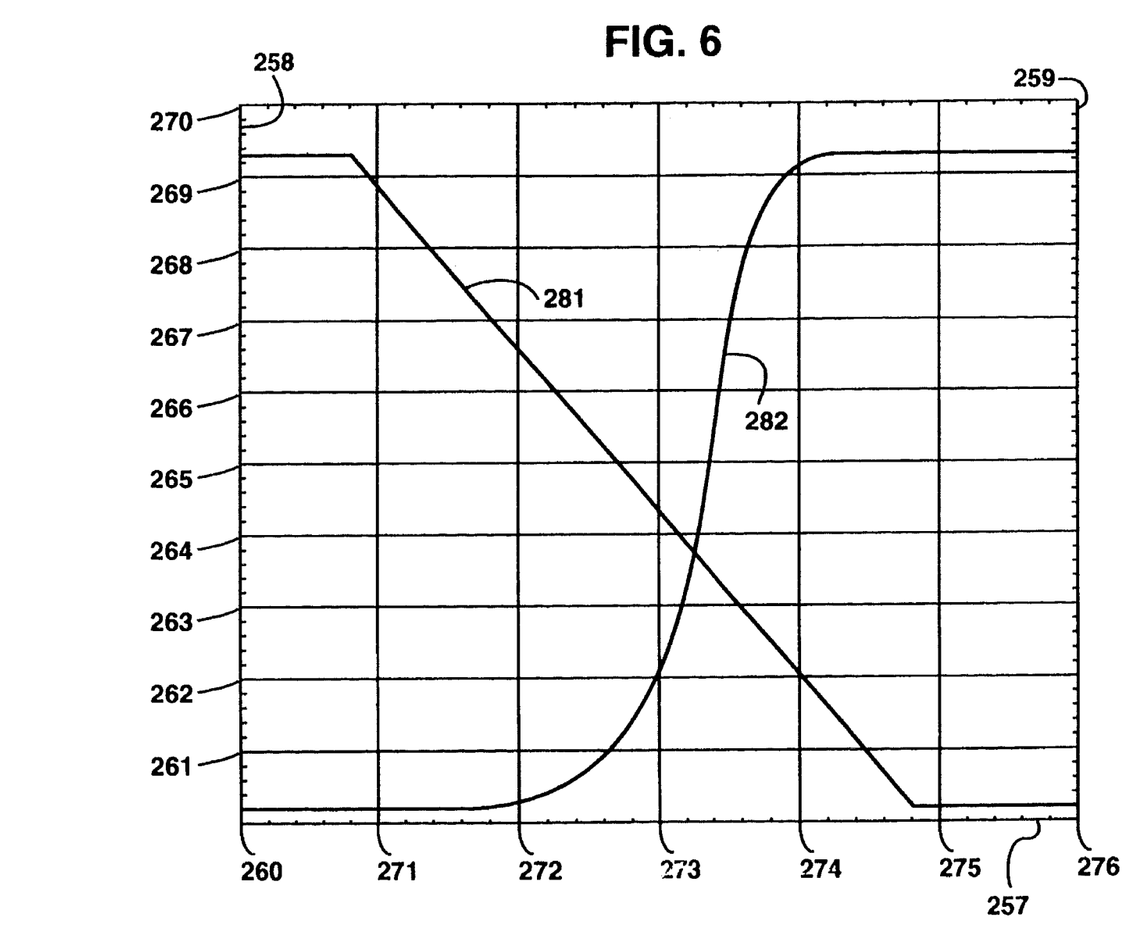
FIG. 6 shows a graph on which is superimposed an input ramp waveform and a resulting output ramp waveform in a second operation region shown in FIG. 4 in accordance with the preferred embodiment of the present invention.

FIG. 6 shows an example of an input ramp 281 and a resulting output signal waveform 282 in slow input ramp regions 175. As may be seen from FIG. 6, input ramp 281 falls at a relatively slow rate as compared to the rate of the rise of signal waveform 282.

Input ramp 281 and output signal waveform 282 are superimposed on a graph 259. A vertical axis 258 of graph 259 represents voltage. A horizontal axis 257 represents passage of time. A zero point 260 of graph 259 indicates zero voltage and the passage of zero nanoseconds. A point 271 on horizontal axis 257 represents the passage of 1.25 nanoseconds. A point 272 on horizontal axis 257 represents the passage of 2.5 nanoseconds. A point 273 on horizontal axis 257 represents the passage of 3.75 nanoseconds. A point 274 on horizontal axis 257 represents the passage of 5.0 nanoseconds. A point 275 on horizontal axis 257 represents the passage of 6.25 nanoseconds. A point 276 on horizontal axis 257 represents the passage of 7.5 nanoseconds. A point 261 on vertical axis 258 represents 0.5 volts. A point 262 on vertical axis 258 represents 1.0 volts. A point 263 on vertical axis 258 represents 1.5 volts. A point 264 on vertical axis 258 represents 2.0 volts. A point 265 on vertical axis 258 represents 2.5 volts. A point 266 on vertical axis 258 represents 3.0 volts. A point 267 on vertical axis 258 represents 3.5 volts. A point 268 on vertical axis 258 represents 4.0 volts. A point 269 on vertical axis 258 represents 4.5 volts. A point 270 on vertical axis 258 represents 5.0 volts.

In fast input ramp region 174, input ramp 251 is completed switched before output signal waveform 252 significantly changes. For a CMOS technology implementation of an inverter, one transistor of the output buffer of the inverter would be on in saturation and the other transistor of the output buffer of the inverter would be off during substantially all the time output signal waveform 252 switches. This is essentially equivalent to a constant current source charging or discharging the load capacitance. In the preferred embodiment of the present invention, for fast input region 174, value $DT_0$ and value $DT_1$ are approximated using the following Formula 4 and Formula 5, respectively:

Formula 4

$$DT_0 = A_0 + B*(INPUT\ RAMP) + D_0*(LOAD)$$

Formula 5

$$DT_1 = A_1 + B*(INPUT\ RAMP) + D_1*(LOAD)$$

In Formulas 4 and 5, values $A_0$, $A_1$, B, $D_0$ and $D_1$ are coefficients which may be determined empirically.

In slow input ramp region 175, input ramp 281 switches so slowly that output signal waveform 282 switches while input ramp 282 is still switching. For a CMOS technology implementation of an inverter, both transistors of the output buffer of the inverter are on when output signal waveform 282 switches. In the preferred embodiment of the present invention, for slow input region 175, value $DT_0$ and value $DT_1$ are approximated using the following Formula 6 and Formula 7, respectively:

Formula 6

$$DT_0 = A_0 + B*(CRITINRAMP) + D_0(LOAD) + Z*(INPUT\ RAMP - CRITINRAMP)$$

Formula 7

$$DT_1 = A_1 + B*(\text{INPUT RAMP}) + D_1*(\text{LOAD})$$

In formula 6, the additional co-efficient Z is a proportionality factor calculated from the DC transfer function between the input voltage and the output voltage. In the slow ramp region, a plot of $DT_0$ versus the input ramp is a straight line for a given output load. Z is the slope of that line and can be calculated from the DC transfer curve. CRITINRAMP is the INPUT RAMP for each load which is along dividing line 173 between fast input ramp region 174 and slow input ramp region 175. In the preferred embodiment of the present invention, the CRITINRAMP (and thus dividing line 173) is defined to be at the point for each load where the end of the input ramp occurs at 50% of the output ramp. Since time 0 is considered to be at the beginning of the input ramp, then the end of the input ramp occurs at INPUT RAMP. Therefore, CRITINRAMP occurs when INPUT RAMP equals $\frac{1}{2}(DT_0+DT_1)$. CRITINRAMP is therefore defined by the following Formula 8:

Formula 8

$$\text{CRITINRAMP} = \frac{1}{2}*(DT_0+DT_1)$$

The coefficients for the formulas may be calculated using circuit simulations. First, three circuit simulations are performed to determine values for the coefficients ($A_0$, $A_1$, B, $D_0$ and $D_1$) used in formula 4 and formula 5. In the circuit simulations values for load and input ramp are chosen so that the three circuit simulations will all fall within fast input ramp region 174. Actually, initially the location of dividing line 173 is not known so that the actual boundaries of fast input ramp region 174 are not known. Therefore, later in the model it is necessary to perform a check to see if the initial three circuit simulations were in fast input ramp region 174. If not, the circuit simulations are performed again using a faster input ramps and/or higher loads.

For each simulation, using formulas 2 and 3, $DT_0$ and $DT_1$ are found. Then using formulas 4 and 5, $A_0$, $A_1$, B, $D_0$ and $D_1$ may be calculated. A first consistency check may be done by solving formulas 4 and 5 separately for the coefficient B. If the coefficient B does not have the same value, then at least one of the circuit simulations was not in fast input ramp region 174.

From the calculated values for coefficients $A_0$, $A_1$, B, $D_0$ and $D_1$, using Formula 8, CRITINRAMP is calculated. Once CRITINRAMP is found, the chosen circuit simulations may again be checked to be sure they fall within fast input ramp region 174.

An additional circuit simulation is performed to find additional points on the DC transfer curve. From these points, the DC transfer function may be approximated. A linear approximation of the DC transfer function yields the proportionality constant Z.

In a manner similar to that described above, coefficients are calculated for each logic device type in a logic device library. Delay through a circuit built from logic devices in the logic device library may then be calculated. Total propagation delay through a circuit is the total amount of time for a signal to propagate through the circuit. The path of logic cells in a circuit through which a signal takes longest to propagate is called the critical path of the circuit. Total propagation for a circuit may be calculated by summing up the total delays through all logic cells in the critical path of the circuit.

Formula 1, for example, may be used to calculate delay through each logic cell. Additionally, starting with the input of the circuit and continuing through to the output of the circuit, the input ramp and the resulting output ramp ($DT_1 - DT_0$) may be calculated for each logic device in the logic path. The output ramp for one logic device is the input ramp for the next logic device. The output ramps are separately calculated for both rising inputs and falling inputs.

To more fully illustrate how the present invention is practiced, an example is given below for the case of an inverter. In the example, three simulations are done with the input ramp and output load (LOAD) listed in Table 1 below:

TABLE 1

| INPUT RAMP | LOAD |
|---|---|
| .25 nS | 1 pF |
| .25 nS | 2 pF |
| 1 nS | 2 pF |

For the first two simulations input voltage (VINPUT) is given by the following Formula 9:

Formula 9

| | |
|---|---|
| VINPUT = 18.2 * TIME | For TIME < .25 nS |
| VINPUT = 4.55 | For TIME > .25 nS |

Similarly, for the third simulation, input voltage (VINPUT) is given by the following Formula 10:

Formula 10

| | |
|---|---|
| VINPUT = 4.55 * TIME | For TIME < 1 nS |
| VINPUT = 4.55 | For TIME > 1 nS |

In the above Formula 9 and Formula 10, TIME is measured from the beginning of the INPUT RAMP and VINPUT is measured in volts.

For each of the simulations, a linear approximation is made of the output of the simulated circuit. The linearization is done by a two point fit through times at which the output voltage is at 3.15 volts and at 1.4 volts.

In the simulation, the results of the linearization are given by Table 2 below:

TABLE 2

| INPUT RAMP | LOAD | Time when OUTPUT = 3.15 V | Time when OUTPUT = 1.4 V |
|---|---|---|---|
| .25 nS | 1 pF | 1.027 nS | 2.107 nS |
| .25 nS | 2 pF | 1.806 nS | 3.911 nS |
| 1 nS | 2 pF | 2.289 nS | 4.394 nS |

Using linear approximation for the first simulation gives an output voltage (VOUTPUT) for the first simulation as given by Formula 11 below:

Formula 11

| | |
|---|---|
| VOUTPUT = 4.55 | For TIME < .163 nS |
| VOUTPUT = 4.55 − 4.55 * (TIME − .163)/(2.971 − .163) | |
| | For .163 nS < TIME < 2.971 nS |
| VOUTPUT = 0 | For TIME > 2.971 nS |

Using linear approximation for the second simulation gives an output voltage (VOUTPUT) for the second simulation as given by Formula 12 below:

Formula 12

VOUTPUT = 4.55           For TIME < .122 nS
VOUTPUT = 4.55 − 4.55 * (TIME − .122)/(5.595 − .122)
                         For .122 nS < TIME < 5.595 nS
VOUTPUT = 0              For TIME > 5.595 nS

Using linear approximation for the third simulation gives an output voltage (VOUTPUT) for the third simulation as given by Formula 13 below:

Formula 13

VOUTPUT = 4.55           For TIME < 1.251 nS
VOUTPUT = 4.55 − 4.55 * (TIME − 1.251)/(6.724 − 1.251)
                         For 1.251 nS < TIME < 6.724 nS
VOUTPUT = 0              For TIME > 6.724 nS

Values for $DT_0$ and $DT_1$ for the three simulations are extracted from the linear approximations as listed in Table 3 below:

TABLE 3

| INPUT RAMP | LOAD | $DT_0$ | $DT_1$ |
|---|---|---|---|
| .25 nS | 1 pF | .163 nS | 2.971 nS |
| .25 nS | 2 pF | .122 nS | 5.595 nS |
| 1 nS | 2 pF | 1.251 nS | 6.724 nS |

Now the values for $DT_0$ and $DT_1$ may be substituted into Formula 4 and Formula 5 to solve for coefficients $A_0$, $A_1$, B, $D_0$ and $D_1$. For example, substituting the values for INPUT RAMP, LOAD and $DT_0$ for the three simulations into Formula 4 gives the following equations:

$$0.163 \text{ nS} = A_0 + B*(0.25 \text{ nS}) + D_0*(1 \text{ pF})$$

$$0.122 \text{ nS} = A_0 + B*(0.25 \text{ nS}) + D_0*(2 \text{ pF})$$

$$1.251 \text{ nS} = A_0 + B*(1.0 \text{ nS}) + D_0*(2 \text{ pF})$$

These three equations are solved for $A_0$, B, and $D_0$ to produce the following values:

$$A_0 = 0.043$$

$$B = 0.644$$

$$D_0 = -0.041$$

Similarly, substituting the values for INPUT RAMP, LOAD and $DT_1$ for the three simulations into Formula 5 gives the following equations:

$$2.971 \text{ nS} = A_1 + B*(0.25 \text{ nS}) + D_1*(1 \text{ pF})$$

$$5.595 \text{ nS} = A_1 + B*(0.25 \text{ nS}) + D_1*(2 \text{ pF})$$

$$6.724 \text{ nS} = A_1 + B*(1.0 \text{ nS}) + D_1*(2 \text{ pF})$$

These three equations are solved for $A_1$, B, and $D_1$ to produce the following values:

$$A_1 = 0.186$$

$$B = 0.644$$

$$D_1 = 2.624$$

The first consistency check is done by noting that the coefficient B has the same value for the solutions of both Formula 4 and Formula 5. If two different values of B had been obtained, it would imply that at least one of the original simulations was not in the fast ramp region. The simulations would have to be redone with faster input ramps and/or larger output loads.

Now that the coefficients have been determined CRITINRAMP may be calculated from Formula 8. For example, Formula 8 is simplified as below (remember that at CRITINRAMP: INPUT RAMP = CRITINRAMP):

CRITINRAMP = ½*($DT_0+DT_1$)

CRITINRAMP = ½* $DT_0$ + ½*$DT_1$

CRITINRAMP = ½*[$A_0$+B*(INPUT RAMP)+$D_0$*(LOAD)] + ½* [$A_1$+B*(INPUT RAMP)+$D_1$*(LOAD)]

CRITINRAMP = ½*($A_0+A_1$) + ½*($D_0+D_1$)*(LOAD) + B*(CRITINRAMP)

CRITINRAMP = ½ *[$A_0+A_1$+($D_0+D_1$)*(LOAD)]/(1−B)

Using the values for the coefficients $A_0$, $A_1$, B, $D_0$ and $D_1$ determined above, CRITINRAMP has the value given in Formula 14 below:

Formula 14

CRITINRAMP = 0.322 + 3.628 *(LOAD)

The second consistency check is done by checking to see whether the three simulations fall within fast input ramp region 174. For the two values for loads used in the three simulations, CRITINRAMP is given by Table 4 below:

TABLE 4

| LOAD | CRITINRAMP |
|---|---|
| 1 pF | 3.950 nS |
| 2 pF | 7.578 nS |

The first simulation was done with a 1 pF load and an input ramp of 0.25 nS. Table 4 indicates this is within fast input ramp region 174. The second and third simulations were done with a 2 pF load and input ramp of 0.25 nS and 1 nS, respectively. Table 4 indicates these are also within fast input ramp region 174.

An additional circuit simulation of DC transfer curves and linear approximations is made to obtain the proportionality constant Z. In the circuit simulation, DC input voltages are found which cause output voltage to be 3.15 volts and 1.4 volts. The circuit simulation yields the values given in Table 5 below:

TABLE 5

| Output Voltage | Input Voltage |
|---|---|
| 3.15 V | 2.176 V |
| 1.40 V | 2.298 V |

Using linear approximations, the DC transfer curve is calculated as given in Formula 15 below:

---
Formula 15
---
VOUTPUT = 4.55              For VINPUT < 2.078
VOUTPUT = 4.55 − 4.55 * (VINPUT − 2.078)/(2.396 − 2.078)
                            For 2.078 < VINPUT < 2.396
VOUTPUT = 0                 For VINPUT > 2.396
---

In the slow ramp region, a plot of $DT_0$ versus the input ramp is a straight line for a given output load. Z is the slope of that line and can be calculated from the DC transfer curve. In determining proportionality constant Z it is helpful to define the following breakpoints. Breakpoint $V^+$ is the value for VINPUT at which VOUTPUT reaches 4.55. Breakpoint $V^-$ is the value for VINPUT at which VOUTPUT reaches 0. For the present example, from Formula 15, it is seen that breakpoint $V^+$ is 2.078 volts and breakpoint $V^-$ is 2.396. Thus, proportionality constant Z may be calculated from Table 6 below:

TABLE 6

| VINPUT | VOUTPUT | Z |
|---|---|---|
| RISING | RISING | $(V^- − 0)/(4.55 − 0)$ |
| RISING | FALLING | $(V^+ − 0)/(4.55 − 0)$ |
| FALLING | RISING | $(4.55 − V^-)/(4.55 − 0)$ |
| FALLING | FALLING | $(4.55 − V^+)/(4.55 − 0)$ |

In the given example, the logic device is an inverter with input rising. Therefore, VINPUT is rising and VOUTPUT is falling. From Table 6, the value of proportionality constant is therefore:

$$Z = 2.078/4.55 = 0.457$$

In the logic device library for the logic device, the values for coefficients $A_0$, $A_1$, B, $D_0$ and $D_1$ are stored. Additionally, the value for CRITINRAMP from Formula 14 is stored and four values calculate from Table 6 are stored for proportionality constant Z. When calculating propagation delay through a first logic device, $DT_0$ of the first logic device is equal to the beginning of an input ramp for a second logic device following the first logic device. Similarly the value $(DT_1 − DT_0)$ for the first logic device is equal to the input ramp for the second logic device. By determining $DT_0$ and $DT_1$ for each logic device and by using the value $(DT_1 − DT_0)$ as an input ramp for a next logic device, the total propagation delay through circuitry is accomplished.

In the above example, the linear approximations assumed perfectly linear inputs. However, tails in the input waveform were not accounted for. The tail in the input waveform has a noticeable effect in fast input region 174; however, the tail in the input waveform has a negligible effect in slow input ramp region 174. To take account of this second order effect, two factors to adjust for the tails (FAT) may be included, one for rising inputs and one for falling inputs. To take these into account, Formula 4 and Formula 5 are modified resulting, respectively, in Formula 16 and Formula 17 given below:

Formula 16

$$DT_0 = A_0 + FAT*B*(\text{INPUT RAMP}) + D_0*(\text{LOAD})$$

Formula 17

$$DT_1 = A_1 + FAT*B*(\text{INPUT RAMP}) + D_1*(\text{LOAD})$$

Figure 7:
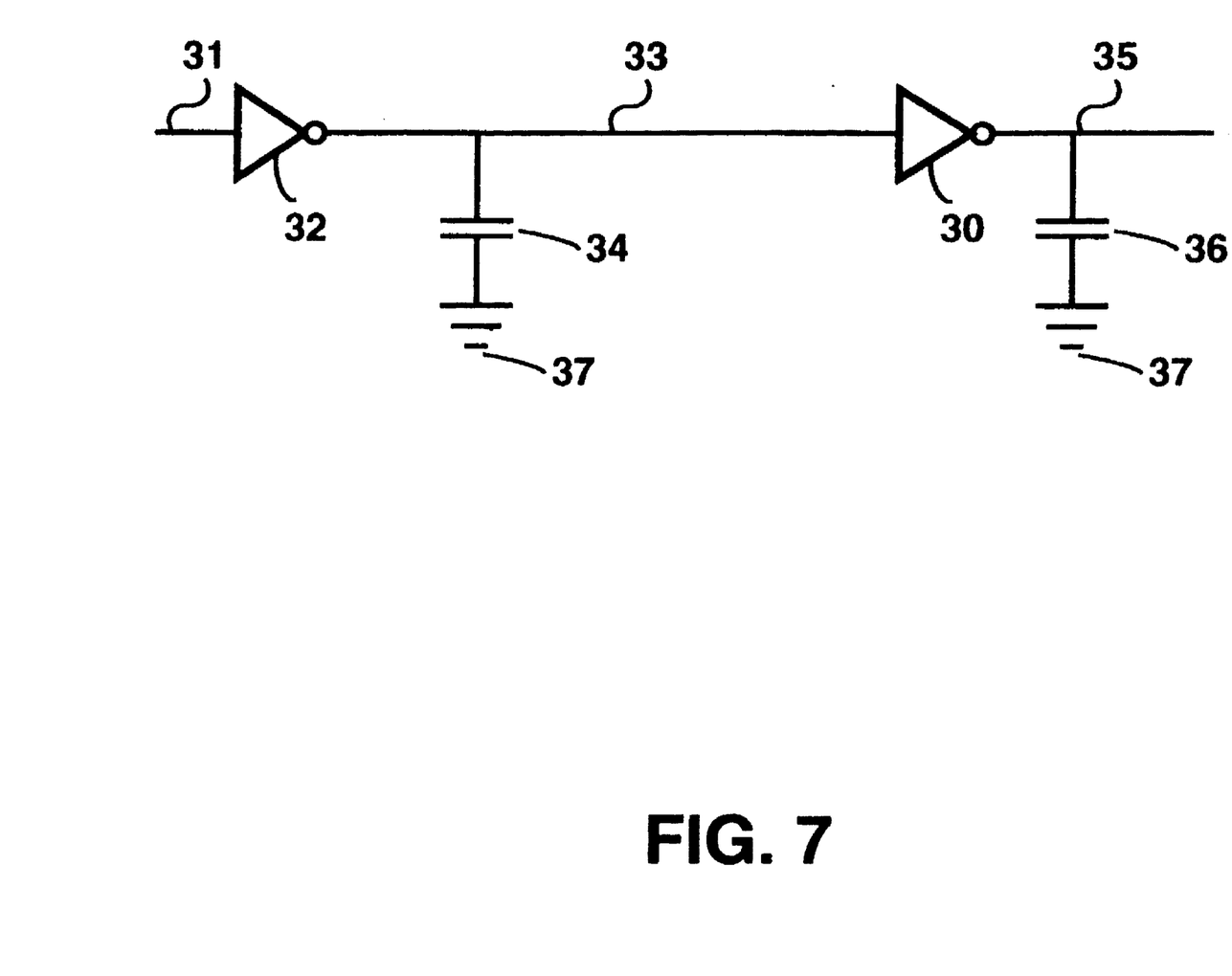
FIG. 7 shows a circuit used for a second order model simulation in accordance with the preferred embodiment of the present invention.

As in the above example, the value FAT may be determined by using circuit simulations. FIG. 7 shows a model used for circuit simulations for the second order model. Timing delay is modeled for an inverter 30. A capacitor 36 connected between an output 35 of inverter 30 and a ground 37 represents output load of inverter 30. A capacitor 34 connected between an input 33 of inverter 30 and ground 37 represents input load of inverter 30. An inverter 32 is used in order to place on input 33 of inverter 30 a realistic voltage, that is an input voltage with a tail.

Three simulations are performed using a falling (linear) input on an input 31 of inverter 32 with a ramp of 0.1 nS. The simulations are performed as described in the prior examples, with the exception each of the three simulations includes a simulation of both inverter 32 and inverter 30. In a first simulation, capacitance 34 (Cint) has a value of 0 pF and capacitance 35 (Cout) has a value of 1 pF. The first simulation of inverter 32 and linear approximation yields the following voltage (Vint) at input 33 of inverter 30, shown by Formula 18 below:

---
Formula 18
---
Vint = 0                For TIME < .064 nS
Vint = 4.55 * (TIME − .064)/(.395 − .064)
                        For .064 nS < TIME < .395 nS
Vint = 4.55             For TIME > .395 nS
---

The first simulation of inverter 30 and linear approximation yields the following voltage (Vout) at output 35 of inverter 30, shown by Formula 19 below:

---
Formula 19
---
Vout = 4.55             For TIME < .311 nS
Vout = 4.55 − 4.55 * (TIME − .311)/(3.126 − .311)
                        For .311 nS < TIME < 3.126 nS
Vout = 0                For TIME > 3.126 nS
---

In Formula 18 and Formula 19, TIME is measured from the beginning of the ramp on input 31 of inverter 32. Inverter 30, therefore, on input 33 sees an input transition that starts at 0.064 nS and ends at 0.395 nS. The output transition on output 35 of inverter 30 starts at 0.311 nS and ends at 3.126 nS. Thus the input ramp on input 33 of inverter 30 is 0.395 minus 0.064, that is 0.331 nS. Using the Formula 2, $DT_0$ is seen to be 0.311 minus 0.064, that is, 0.247 nS. Using Formula 3, $DT_1$ is seen to be 3.126 minus 0.064, that is, 3.062 nS.

Table 7 below summarizes the results of all three simulations:

TABLE 7

| Cint | Cout | INPUT RAMP | $DT_0$ | $DT_1$ |
|---|---|---|---|---|
| 0 pF | 1 pF | .331 nS | .247 nS | 3.062 nS |
| 0 pF | 2 pF | .331 nS | .206 nS | 5.686 nS |
| .2 pF | 2 pF | .826 nS | .826 nS | 6.040 nS |

The above values are used to solve for the coefficients $a_0$, $a_1$, b, $d_0$ and $d_1$ in the following following Formula 20 and Formula 21:

Formula 20

$$DT_0 = a_0 + b*(\text{INPUT RAMP}) + d_0*(\text{Cout})$$

Formula 21

$$DT_1 = d_1 + b*(\text{INPUT RAMP}) + d_1*(\text{Cout})$$

Formula 20 and Formula 21 uses the coefficients $a_0$, $a_1$, b, $d_0$ and $d_1$ because the values of the coefficients sometimes vary from the values of the coefficients $A_0$, $A_1$, B, $D_0$ and $D_1$ used in the first order model. As above, the values in Table 7 provide for three sets of equations for Formula 20 and Formula 21. Solving the three equations yields the following values:

$a_0 = 0.051$ $a_1 = 0.201$ $b = 0.715$ $d_0 = -0.041$ $d_1 = 2.624$

When these are compared with the values for $A_0$, $A_1$, B, $D_0$ and $D_1$ calculated above, it is seen that the values for $d_0$ and $d_1$ are equivalent to the values for $D_0$ and $D_1$, respectively. The values for $a_0$ and $a_1$ vary slightly from the values for $A_0$ and $A_1$, respectively. The most significant difference is between the value for b and the value for B. The value FAT is obtained by the ratio of b to B, as shown by Formula 22 below:

Formula 22

$$FAT = b/B$$
$$= .715/.644$$
$$= 1.11$$

Once calculated, the value for FAT is stored in the logic device library along with the values for the coefficients $A_0$, $A_1$, B, $D_0$ and $D_1$. The value for FAT is dependent on the process technology and does not depend on the logic design of a logic cell. Therefore, a single entry for the value of FAT may be obtained from characterization of a single logic cell and stored for use for all logic cells in a cell library.

The value for CRITINRAMP for the second order model may be recalculated from Formula 8, to be as set out in Formula 23 below:

Formula 23

$$CRITINRAMP = \frac{1}{2} * [A_0 + A_1 + (D_0 + D_1) * (LOAD)]/(1 - FAT*B)$$

Using the values for the coefficients $A_0$, $A_1$, B, $D_0$, $D_1$ and FAT determined above, CRITINRAMP has the value given in Formula 24 below:

Formula 24

$$CRITINRAMP = 0.402 + 4.532 * (LOAD)$$

Using the second order model, the following Formula 25 and Formula 26 are used to calculate $DT_0$ and $DT_1$ in slow input ramp region 175:

Formula 25

$$DT_0 = DT_0(CRITINRAMP) + Z*(INPUT\ RAMP - CRITINRAMP)$$

Formula 26

$$DT_1 = DT_1(CRITINRAMP) + B*(INPUT\ RAMP - CRITINRAMP)$$

In Formula 25, $DT_0(CRITINRAMP)$ is the value of $DT_0$ at CRITINRAMP. In Formula 26, $DT_1(CRITINRAMP)$ is the value of $DT_1$ at CRITINRAMP.

Once the logic device has been characterized, as above, it is possible to determine a value for $DT_0$ and $DT_1$ for any input ramp and load. For example, suppose the load (LOAD) is equal to 0.5 pF and the input ramp is equal to 0.25 nS. Then, using Formula 24, CRITINRAMP has the following value:

$$CRITINRAMP = 0.402 + 4.532 * (LOAD)$$

$$CRITINRAMP = 0.402 + 4.532 * (0.5)$$

$$CRITINRAMP = 2.668\ nS$$

Since the input ramp (0.25 nS) is smaller than the CRITINRAMP (2.668 nS), the example falls in fast input ramp region 174. Therefore, Formula 16 is used to calculate $DT_0$ and Formula 17 is used to calculate $DT_1$, as shown below:

$$DT_0 = A_0 + FAT*B*(INPUT\ RAMP) + D_0*(LOAD)$$

$$DT_0 = 0.043 + 1.11*0.644*(0.25) - 0.041*(0.5)$$

$$DT_0 = 0.201\ nS$$

$$DT_1 = A_1 + FAT*B*(INPUT\ RAMP) + D_1*(LOAD)$$

$$DT_1 = 0.186 + 1.11*0.644*(0.25) + 2.624*(0.5)$$

$$DT_1 = 1.677\ nS$$

As an alternate example, suppose the load (LOAD) is equal to 0.5 pF and the input ramp is equal to 3 nS. Then CRITINRAMP still has the following value:

$$CRITINRAMP = 0.402 + 4.532 * (LOAD)$$

$$CRITINRAMP = 0.402 + 4.532 * (0.5)$$

$$CRITINRAMP = 2.668\ nS$$

Since the input ramp (3 nS) is now larger than the CRITINRAMP (2.668 nS), the example falls in slow input ramp region 175. Therefore, Formula 25 is used to calculate $DT_0$ and Formula 26 is used to calculate $DT_1$. First $DT_0(CRITINRAMP)$ and $DT_1(CRITINRAMP)$ are calculated as shown below:

$$DT_0(CRITINRAMP) = A_0 + FAT*B*(CRITINRAMP) + D_0*(LOAD)$$

$$DT_0(CRITINRAMP) = 0.043 + 1.11*0.644*(2.668) - 0.041*(0.5)$$

$$DT_0(CRITINRAMP) = 1.930\ nS$$

$$DT_1(CRITINRAMP) = A_1 + FAT*B*(CRITINRAMP) + D_1*(LOAD)$$

$$DT_1(CRITINRAMP) = 0.186 + 1.11*0.644*(2.668) + 2.624*(0.5)$$

$$DT_1(CRITINRAMP) = 3.406\ nS$$

Once $DT_0(CRITINRAMP)$ and $DT_1(CRITINRAMP)$ have been calculated, Formula 25 is used to calculate $DT_0$ and Formula 26 is used to calculate $DT_1$, as shown below:

$$DT_0 = DT_0(CRITINRAMP) + Z*(INPUT\ RAMP - CRITINRAMP)$$

$$DT_0 = 1.930 + 0.457 * (3 - 2.668)$$

$DT_0 = 2.082$ nS $DT_1 = DT_1(\text{CRITINRAMP}) + B*(\text{INPUT RAMP} - \text{CRITINRAMP})$ $DT_1 = 3.406 + 0.644 * (3 - 2.668)$ $DT_1 = 3.620$ nS As discussed above the input ramp for the following logic device is equal to $DT_1 - DT_0$.

The foregoing discussion discloses and describes merely exemplary methods and embodiments of the present invention. As will be understood by those familiar with the art, the invention may be embodied in other specific forms without departing from the spirit or essential characteristics thereof. For example, the present invention may be implemented by a computer. Accordingly, the disclosure of the present invention is intended to be illustrative, but not limiting, of the scope of the invention, which is set forth in the following claims.

I claim:

1. A computer implemented method comprising the steps of:
   (a) designing, under the direction of a computer user, logic circuitry; and,
   (b) simulating, by a computer, function of the logic circuitry, including modeling propagation delay through a logic device within the logic circuitry, the modeling including the following substeps:
      (b.1) dividing operation of the logic device into a first region and a second region, a boundary between the first region and the second region being based on duration of input ramp to the logic device and amount of capacitive load driven by the logic device,
      (b.2) when the logic device operates in the first region, using a first formula to obtain a first value representing delay through the logic device, the first formula varying the first value based on the duration of the input ramp to the logic device and the capacitive load driven by the logic device, wherein the input ramp of the logic device is determined for an input of the logic device transitioning from a first voltage level to a second voltage level and wherein the first formula has a form as follows:

$DT = A + B*(\text{INPUT RAMP}) + D*(\text{LOAD})$ where DT represents the first value, INPUT RAMP represents duration of the input ramp, LOAD represents capacitive load driven by the logic device, and A, B and D are coefficients determined using circuit simulations, and
      (b.3) when the logic device operates in the second region, using a second formula to obtain the first value, the second formula varying the first value based on the duration of the input ramp to the logic device and the capacitive load driven by the logic device, wherein the input ramp of the logic device is determined for an input of the logic device transitioning from the first voltage level to the second voltage level, wherein the second formula has a form as follows:

$DT = A + B*(\text{CRITINRAMP}) + D*(\text{LOAD}) + Z*(\text{INPUT RAMP} - \text{CRITINRAMP})$ wherein CRITINRAMP represents INPUT RAMP at the border between the first region and the second region for the LOAD, and Z is a determined using circuit simulations.

2. A computer implemented method comprising the steps of:
   (a) designing, under direction of a computer user, logic circuitry; and,
   (b) simulating, by a computer, function of the logic circuitry, including modeling propagation delay through a logic device within the logic circuitry, the modeling including the following substeps:
      (b.1) dividing operation of the logic device into a first region and a second region, a boundary between the first region and the second region being based on duration of input ramp to the logic device and amount of capacitive load driven by the logic device,
      (b.2) when the logic device operates in the first region, using a first formula to obtain a first value representing delay through the logic device, the first formula varying the first value based on the duration of the input ramp to the logic device and the capacitive load driven by the logic device, wherein the input ramp of the logic device is determined for an input of the logic device transitioning from a first voltage level to a second voltage level and wherein the first formula has a form as follows:

$DT = A + \text{FAT}*B*(\text{INPUT RAMP}) + D*(\text{LOAD})$ wherein DT represents the first value, INPUT RAMP represents duration of the input ramp, LOAD represents capacitive load driven by the logic device, and A, B, D and FAT are coefficients determined using circuit simulations, and
      (b.3) when the logic device operates in the second region, using a second formula to obtain the first value, the second formula varying the first value based on the duration of the input ramp to the logic device and the capacitive load driven by the logic device, wherein the input ramp of the logic device is determined for an input of the logic device transitioning from the first voltage level to the second voltage level wherein the second formula has a form as follows:

$DT = DT(\text{CRITINRAMP}) + Z*(\text{INPUT RAMP} - \text{CRITINRAMP})$ wherein CRITINRAMP represents INPUT RAMP at the border between the first region and the second region for the LOAD, Z is a coefficient determined using circuit simulations, and $DT_{(CRITINRAMP)}$ is the first value when the logic ramp has an input ramp equal to CRITINRAMP and a load equal to LOAD.

3. A computer implemented method comprising the steps of:
   (a) designing, under direction of a computer user, logic circuitry; and,
   (b) simulating, by a computer, function of the logic circuitry, including modeling propagation delay through a logic device and calculating a next input ramp for a next logic device coupled to an output of the logic device, the logic device and the next logic device being within the logic circuitry and the modeling including the following substeps:
      (b.1) dividing operation of the logic device into a first region and a second region, a boundary between the first region and the second region being based on duration of input ramp to the logic device and amount of capacitive load driven by the logic device, (b.2) when the logic device operates in the first region, using a first formula to obtain a first value representing delay through the logic device, the first formula varying the first value based on the duration of the input ramp to the logic device and the capacitive load driven by the logic device, (b.3) when the logic device operates in the second region, using a second formula to obtain the first value, the second formula varying the first value based on the duration of the input ramp to the logic device and the capacitive load driven by the logic device, (b.4) when the logic device operates in the first region, using a third formula to generate a second value representing duration from beginning of the input ramp of the logic device to an end of an output ramp of the logic device, the second value being based on the length of the input ramp to the logic device and the amount of the load driven by the logic device, (b.5) when the logic device operates in the second region, using a fourth formula to generate the second value, and (b.6) subtracting the first value from the second value to obtain the next input ramp.

4. A computer implemented method as in claim 3 wherein the first formula has a form as follows:

$$DT_0 = A_0 + B*(INPUT\ RAMP) + D_0*(LOAD)$$

where $DT_0$ represents the first value, INPUT RAMP represents duration of the input ramp, LOAD represents capacitive load driven by the logic device, and $A_0$, B and $D_0$ are coefficients determined using circuit simulations.

5. A computer implemented method as in claim 4 wherein the third formula has a form as follows:

$$DT_1 = A_1 + B*(INPUT\ RAMP) + D_1*(LOAD)$$

where $DT_1$ represents the second value, and $A_1$ and $D_1$ are coefficients determined using circuit simulations.

6. A computer implemented method as in claim 5 wherein the second formula has a form as follows:

$$DT_0 = A_0 + B*(CRITINRAMP) + D_0*(LOAD) + Z*(INPUT\ RAMP - CRITINRAMP)$$

wherein CRITINRAMP represents INPUT RAMP at the border between the first region and the second region for the LOAD, and Z is determined using circuit simulations.

7. A computer implemented method as in claim 6 wherein the fourth formula has a form as follows:

$$DT_1 = A_1 + B*(INPUT\ RAMP) + D_1*(LOAD).$$

8. A computer implemented method as in claim 3 wherein the first formula has a form as follows:

$$DT_0 = A_0 + FAT*B*(INPUT\ RAMP) + D_0*(LOAD)$$

wherein $DT_0$ represents the first value, INPUT RAMP represents duration of the input ramp, LOAD represents capacitive load driven by the logic device, and $A_0$, B, $D_0$ and FAT are coefficients determined using circuit simulations.

9. A computer implemented method as in claim 8 wherein the third formula has a form as follows:

$$DT_1 = A_1 + FAT*B*(INPUT\ RAMP) + D_1*(LOAD)$$

wherein $DT_1$ represents the second value, and $A_1$ and $D_1$ are coefficients determined using circuit simulations.

10. A computer implemented method as in claim 9 wherein the second formula has a form as follows:

$$DT_0 = DT_{0(CRITINRAMP)} + Z*(INPUT\ RAMP - CRITINRAMP)$$

wherein CRITINRAMP represents INPUT RAMP at the border between the first region and the second region for the LOAD, Z is a coefficient determined using circuit simulations, and $DT_{(CRITINRAMP)}$ is the first value when the logic ramp has an input ramp equal to CRITINRAMP and a load equal to LOAD.

11. A computer implemented method as in claim 10 wherein the fourth formula has a form as follows:

$$DT_1 = DT_{1(CRITINRAMP)} + B*(INPUT\ RAMP - CRITINRAMP).$$

12. A computer implemented method as in claim 3 wherein in step (a) the boundary between the first region and the second occurs where for each value of the capacitive load, the output ramp is one half complete when the input ramp is complete.

13. A computer implemented method comprising the steps of:

(a) designing, under direction of a computer user, logic circuitry; and, (b) simulating, by a computer, function of the logic circuitry, including modeling propagation delay through a logic device within the logic circuitry, the modeling including the following substeps:

(b.1) dividing operation of the logic device into a first region and a second region, a boundary between the first region and the second region being based on duration of input ramp to the logic device and amount of capacitive load driven by the logic device wherein the boundary between the first region and the second occurs where for each value of the capacitive load, an output ramp for the logic device is partially complete when the input ramp is complete, (b.2) when the logic device operates in the first region, using a first formula to obtain a first value representing delay through the logic device, the first formula varying the first value based on the duration of the input ramp to the logic device and the capacitive load driven by the logic device, wherein the input ramp of the logic device is determined for an input of the logic device transitioning from a first voltage level to a second voltage level, and (b.3) when the logic device operates in the second region, using a second formula to obtain the first value, the second formula varying the first value based on the duration of the input ramp to the logic device and the capacitive load driven by the logic device, wherein the input ramp of the logic device is determined for an input of the logic device transitioning from the first voltage level to the second voltage level.

14. A computer implemented method as in claim 13 wherein the second voltage level is higher than the first voltage level.

15. A computer implemented method as in claim 13 wherein the first voltage level is higher than the second voltage level.

16. A computer implemented method as in claim 13 wherein the first formula has a form as follows:

DT=A+B*(INPUT RAMP)+D*(LOAD)

where DT represents the first value, INPUT RAMP represents duration of the input ramp, LOAD represents capacitive load driven by the logic device, and A, B and D are coefficients determined using circuit simulations.

17. A computer implemented method as in claim 13 wherein the first formula has a form as follows:

DT=A+FAT*B*(INPUT RAMP)+D*(LOAD)

wherein DT represents the first value, INPUT RAMP represents duration of the input ramp, LOAD represents capacitive load driven by the logic device, and A, B, D and FAT are coefficients determined using circuit simulations.

18. A computer implemented method comprising the steps of:
  (a) providing a timing model of a logic device within logic circuitry, the timing model including propagation delay through the logic device; and,
  (b) modeling the propagation delay through the logic device, including the following substeps:
    (b.1) dividing operation of the logic device into a first region and a second region, a boundary between the first region and the second region being based on duration of input ramp to the logic device and amount of capacitive load driven by the logic device wherein the boundary between the first region and the second occurs at locations where for each value of the capacitive load, an output ramp for the logic device has begun to transition before the input ramp is complete,
    (b.2) when the logic device operates in the first region, using a first formula to obtain a first value representing delay through the logic device, the first formula varying the first value based on the duration of the input ramp to the logic device and the capacitive load driven by the logic device, wherein the input ramp of the logic device is determined for an input of the logic device transitioning from a first voltage level to a second voltage level, and
    (b.3) when the logic device operates in the second region, using a second formula to obtain the first value, the second formula varying the first value based on the duration of the input ramp to the logic device and the capacitive load driven by the logic device, wherein the input ramp of the logic device is determined for an input of the logic device transitioning from the first voltage level to the second voltage level.

19. A computer implemented method as in claim 18 wherein the second voltage level is higher than the first voltage level.

20. A computer implemented method as in claim 18 wherein the first voltage level is higher than the second voltage level.

21. A computer implemented method as in claim 18 wherein the first formula has a form as follows:

DT=A+B*(INPUT RAMP)+D*(LOAD)

where DT represents the first value, INPUT RAMP represents duration of the input ramp, LOAD represents capacitive load driven by the logic device, and A, B and D are coefficients determined using circuit simulations.

22. A computer implemented method as in claim 21 wherein the second formula has a form as follows:

DT=A+B*(CRITINRAMP)+D*(LOAD)+Z*(INPUT RAMP−CRITINRAMP)

wherein CRITINRAMP represents INPUT RAMP at the border between the first region and the second region for the LOAD, and Z is a determined using circuit simulations.

23. A computer implemented method as in claim 18 wherein the first formula has a form as follows:

DT=A+FAT*B*(INPUT RAMP)+D*(LOAD)

wherein DT represents the first value, INPUT RAMP represents duration of the input ramp, LOAD represents capacitive load driven by the logic device, and A, B, D and FAT are coefficients determined using circuit simulations.

24. A computer implemented method as in claim 23 wherein the second formula has a form as follows:

$$DT=DT_{(CRITINRAMP)}+Z*(INPUT\ RAMP-CRITINRAMP)$$

wherein CRITINRAMP represents INPUT RAMP at the border between the first region and the second region for the LOAD, Z is a coefficient determined using circuit simulations, and $DT_{(CRITINRAMP)}$ is the first value when the logic ramp has an input ramp equal to CRITINRAMP and a load equal to LOAD.

25. A computer implemented method as in claim 18 wherein in substep (b.1) the boundary between the first region and the second occurs where for each value of the capacitive load, an output ramp for the logic device is one half complete when the input ramp is complete.

26. A computer implemented method comprising the steps of:
  (a) providing a timing model of a logic device within logic circuitry, the timing model including propagation delay through the logic device; and,
  (b) modeling the propagation delay through the logic device, including the following substeps:
    (b.1) dividing operation of the logic device into a fast input ramp region, wherein an input ramp to the logic device is completely switched before the output signal wave form changes significantly, and a slow input ramp region, wherein the input ramp switches so slowly that the output signal switches while the input ramp is still switching, a boundary between the fast input ramp region and the slow input ramp region being based on duration of input ramp to the logic device and amount of capacitive load driven by the logic device,
    (b.2) when the logic device operates in the fast input ramp region, using a first formula to obtain a first value representing delay through the logic device, the first formula varying the first value based on the duration of the input ramp to the logic device and the capacitive load driven by the logic device, and
    (b.3) when the logic device operates in the slow input ramp region, using a second formula to obtain the first value, the second formula varying the first value based on the duration of the input ramp to the logic device and the capacitive load driven by the logic device.

27. A computer implemented method as in claim 26 wherein the first formula has a form as follows:

DT=A+B*(INPUT RAMP)+D*(LOAD)

where DT represents the first value, INPUT RAMP represents duration of the input ramp, LOAD represents capacitive load driven by the logic device, and A, B and D are coefficients determined using circuit simulations.

28. A computer implemented method as in claim 27 wherein the second formula has a form as follows:

DT=A+B*(CRITINRAMP)+D*(LOAD)+Z*(INPUT RAMP–CRITINRAMP)

wherein CRITINRAMP represents INPUT RAMP at the border between the fast input ramp region and the slow input ramp region for the LOAD, and Z is a determined using circuit simulations.

29. A computer implemented method as in claim 26 wherein the first formula has a form as follows:

DT=A+FAT*B*(INPUT RAMP)+D*(LOAD)

wherein DT represents the first value, INPUT RAMP represents duration of the input ramp, LOAD represents capacitive load driven by the logic device, and A, B, D and FAT are coefficients determined using circuit simulations.

30. A computer implemented method as in claim 29 wherein the second formula has a form as follows:

DT=DT$_{(CRITINRAMP)}$+Z*(INPUT RAMP–CRITINRAMP)

wherein CRITINRAMP represents INPUT RAMP at the border between the fast input ramp region and the slow input ramp region for the LOAD, Z is a coefficient determined using circuit simulations, and DT$_{(CRITINRAMP)}$ is the first value when the logic ramp has an input ramp equal to CRITINRAMP and a load equal to LOAD.

31. A computer implemented method as in claim 26 additionally comprising the following step:
  (c) calculating a next input ramp for a next logic device coupled to an output of the logic device, including the substeps of:
    (c.1) when the logic device operates in the fast input ramp region, using a third formula to generate a second value representing duration from beginning of the input ramp of the logic device to an end of an output ramp of the logic device, the second value being based on the length of the input ramp to the logic device and the amount of the load driven by the logic device,
    (c.2) when the logic device operates in the slow input ramp region, using a fourth formula to generate the second value, and
    (c.3) subtracting the first value from the second value to obtain the next input ramp.

32. A computer implemented method as in claim 31 wherein the first formula has a form as follows:

DT$_0$=A$_0$+B*(INPUT RAMP)+D$_0$*(LOAD)

where DT$_0$ represents the first value, INPUT RAMP represents duration of the input ramp, LOAD represents capacitive load driven by the logic device, and A$_0$, B and D$_0$ are coefficients determined using circuit simulations.

33. A computer implemented method as in claim 32 wherein the third formula has a form as follows:

DT$_1$=A$_1$+B*(INPUT RAMP)+D$_1$*(LOAD)

where DT$_1$ represents the second value, and A$_1$ and D$_1$ are coefficients determined using circuit simulations.

34. A computer implemented method as in claim 33 wherein the second formula has a form as follows:

DT$_0$=A$_0$+B*(CRITINRAMP)+D$_0$*(LOAD)+Z*(INPUT RAMP–CRITINRAMP)

wherein CRITINRAMP represents INPUT RAMP at the border between the fast input ramp region and the slow input ramp region for the LOAD, and Z is determined using circuit simulations.

35. A computer implemented method as in claim 34 wherein the fourth formula has a form as follows:

DT$_1$=A$_1$+B*(INPUT RAMP)+D$_1$*(LOAD).

36. A computer implemented method as in claim 31 wherein the first formula has a form as follows:

DT$_0$=A$_0$+FAT*B*(INPUT RAMP)+D$_0$*(LOAD)

wherein DT$_0$ represents the first value, INPUT RAMP represents duration of the input ramp, LOAD represents capacitive load driven by the logic device, and A$_0$, B, D$_0$ and FAT are coefficients determined using circuit simulations.

37. A computer implemented method as in claim 36 wherein the third formula has a form as follows:

DT$_1$=A$_1$+FAT*B*(INPUT RAMP)+D$_1$*(LOAD)

wherein DT$_1$ represents the second value, and A$_1$ and D$_1$ are coefficients determined using circuit simulations.

38. A computer implemented method as in claim 37 wherein the second formula has a form as follows:

DT$_0$=DT$_{0(CRITINRAMP)}$+Z*(INPUT RAMP–CRITINRAMP)

wherein CRITINRAMP represents INPUT RAMP at the border between the fast input ramp region and the slow input ramp region for the LOAD, Z is a coefficient determined using circuit simulations, and DT$_{(CRITINRAMP)}$ is the first value when the logic ramp has an input ramp equal to CRITINRAMP and a load equal to LOAD.

39. A computer implemented method as in claim 38 wherein the fourth formula has a form as follows:

DT$_1$=DT$_{1(CRITINRAMP)}$+B*(INPUT RAMP–CRITINRAMP).

40. A computer implemented method as in claim 31 wherein in substep (b.1) the boundary between the fast input ramp region and the slow input ramp region occurs where for each value of the capacitive load, the output ramp is one half complete when the input ramp is complete.

41. A computer implemented method as in claim 26 wherein in substep (b.1) the boundary between the fast input ramp region and the slow input ramp region occurs where for each value of the capacitive load, an output ramp for the logic device is one half complete when the input ramp is complete.

* * * * *